(12) United States Patent
Chung et al.

(10) Patent No.: US 10,594,318 B2
(45) Date of Patent: Mar. 17, 2020

(54) ELECTRIC CIRCUIT ARRANGEMENT AND A METHOD FOR GENERATING ELECTRIC CURRENT PULSES TO A LOAD

(71) Applicant: City University of Hong Kong, Kowloon (HK)

(72) Inventors: Shu Hung Henry Chung, Mid-levels (HK); Chung Pui Tung, Kennedy Town (HK); Wing To Fan, Fanling (HK); Po Wa Chow, Shatin (HK); Sui Pung Cheung, Kowloon (HK)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 44 days.

(21) Appl. No.: 15/689,039

(22) Filed: Aug. 29, 2017

(65) Prior Publication Data

US 2019/0068187 A1    Feb. 28, 2019

(51) Int. Cl.

| | |
|---|---|
| *H05B 33/08* | (2020.01) |
| *H01L 23/52* | (2006.01) |
| *H02M 1/00* | (2006.01) |
| *H02M 3/155* | (2006.01) |
| *H02M 7/155* | (2006.01) |
| *H03K 5/153* | (2006.01) |

(Continued)

(52) U.S. Cl.
CPC .............. *H03K 17/732* (2013.01); *H01F 7/18* (2013.01); *H02H 7/1257* (2013.01); *H03K 5/153* (2013.01); *H03K 17/063* (2013.01); *H03K 17/08128* (2013.01); *H04M 1/312* (2013.01); *H01L 23/52* (2013.01); *H02M 3/155* (2013.01); *H02M 7/155* (2013.01); *H02M 2001/0003* (2013.01); *H02M 2001/0083* (2013.01); *H05B 33/0815* (2013.01); *H05B 33/0848* (2013.01)

(58) Field of Classification Search
CPC ........ H04M 1/312; H02H 7/1257; H01F 7/18; H01L 23/48; H01L 23/52; H01S 3/09; H01S 5/042; H01S 5/0427; H01S 5/0428; H01S 5/062; H01S 5/065; H01S 5/06808; H01S 5/06812; H01S 5/4018; H05B 33/08; H05B 33/0803; H05B 33/0806; H05B 33/0809; H05B 33/0812; H05B 33/0815; H05B 33/0821; H05B 33/0824; H05B 33/083; H05B 33/0842; H05B 33/0845; H05B 33/0848; H02M 2001/0003; H02M 2001/0083; H02M 3/155; H02M 7/155
USPC ....................... 372/38.07; 315/287, 307, 308
See application file for complete search history.

(56) References Cited

U.S. PATENT DOCUMENTS 4,346,309 A * 8/1982 Garrett .................... H02M 1/06
                                                                        324/762.01
4,791,350 A * 12/1988 Roof ..................... H02M 3/1563
                                                                        323/284

(Continued)

*Primary Examiner* — Nguyen Tran
*Assistant Examiner* — David A. Singh
(74) *Attorney, Agent, or Firm* — Renner Kenner Greive Bobak Taylor & Weber

(57) ABSTRACT

An electric circuit arrangement and a method for generating electric current pulses to a load, the electric circuit arrangement including a switch and a current source in series connection with the load; wherein the switch is arranged to operate in at least an on state and an off state, thereby selectively connecting or disconnecting the current source to or from the load so as to generate the electric current pulses. With such architecture, the circuit performs with a better efficiency than a cascaded architecture.

28 Claims, 15 Drawing Sheets

(51) Int. Cl.
  *H04M 1/31*      (2006.01)
  *H03K 17/732*    (2006.01)
  *H03K 17/06*     (2006.01)
  *H02H 7/125*     (2006.01)
  *H01F 7/18*      (2006.01)
  *H03K 17/0812*   (2006.01)

(56) References Cited

U.S. PATENT DOCUMENTS

| | | | | |
|---|---|---|---|---|
| 5,942,810 | A * | 8/1999 | Jisland | G01S 7/4008 307/44 |
| 6,552,599 | B1 * | 4/2003 | Xu | G05F 3/16 327/419 |
| 9,661,708 | B1 * | 5/2017 | De Cicco | H05B 33/0887 |
| 2009/0284178 | A1 * | 11/2009 | Jessenig | H02M 3/156 315/297 |
| 2011/0031895 | A1 * | 2/2011 | Liu | H05B 33/0818 315/294 |
| 2011/0305054 | A1 * | 12/2011 | Yamagiwa | H01L 29/42316 363/125 |
| 2013/0169256 | A1 * | 7/2013 | Cortigiani | H05B 33/0818 323/299 |
| 2014/0015428 | A1 * | 1/2014 | Tao | H05B 33/0809 315/187 |
| 2014/0191659 | A1 * | 7/2014 | Wu | H05B 33/0812 315/53 |
| 2014/0232271 | A1 * | 8/2014 | Wiegele | H05B 33/0815 315/127 |
| 2014/0312769 | A1 * | 10/2014 | Manor | H05B 33/0815 315/85 |
| 2015/0319818 | A1 * | 11/2015 | Kahlman | H05B 37/0209 315/201 |
| 2017/0006675 | A1 * | 1/2017 | van den Broeke | H02M 1/08 |
| 2017/0142789 | A1 * | 5/2017 | Cohen | H05B 33/0815 |
| 2019/0052258 | A1 * | 2/2019 | Donovan | H03K 19/00346 |

* cited by examiner

ELECTRIC CIRCUIT ARRANGEMENT AND A METHOD FOR GENERATING ELECTRIC CURRENT PULSES TO A LOAD

TECHNICAL FIELD

The present invention relates to an electric circuit arrangement and a method for generating electric current pulses to a load, although not exclusively, to an electric circuit arrangement arranged to generate desired current pulses to a load from an unregulated direct current (DC) source.

BACKGROUND

Electronic or electrical apparatuses usually operate with predetermined electrical ratings, such as a desired current and/or voltage profile. In general, power converters may be included in an apparatus to convert or regulate an electrical power supplied from an electrical source to the required current and/or voltage. This may include a conversion of AC to DC, a step-up or step-down DC voltage conversion, etc.

Multiple power-conversion stages may be included to process and/or to regulate the power supply from the AC main to the electrical load. For example, an AC power supplies may be processed by multiple stages to become a DC electric voltage and current which may be used for driving a DC electric load.

SUMMARY OF THE INVENTION

In accordance with a first aspect of the present invention, there is provided an electric circuit arrangement for generating electric current pulses to a load, comprising a switch and a current source in series connection with the load; wherein the switch is arranged to operate in at least an on state and an off state, thereby selectively connects or disconnect the current source to or from the load so as to generate the electric current pulses.

In an embodiment of the first aspect, the electric current pulses are generated from a DC source having a high voltage ripple.

In an embodiment of the first aspect, the electric circuit arrangement further comprises a diode in connection with the switch and the current source, and arranged to operate in forward-bias when the switch is in the off state.

In an embodiment of the first aspect, the diode is arranged to provide an electric path for the current source to freewheel.

In an embodiment of the first aspect, an amount of current through the load equals to zero when the switch is in the off state.

In an embodiment of the first aspect, the diode is a freewheel diode.

In an embodiment of the first aspect, the electric circuit arrangement further comprises a controller arranged to control the switch and/or the current source.

In an embodiment of the first aspect, the controller is arranged to control a conduction period and a switching frequency of the switch.

In an embodiment of the first aspect, the controller is arranged to detect an output load current through the load so as to control the switch based on the output load current.

In an embodiment of the first aspect, the controller is arranged to regulate a current through the current source.

In an embodiment of the first aspect, the controller is arranged to detect the current through the current source so as to regulate the current source.

In an embodiment of the first aspect, the current source comprises a transistor and a voltage source.

In an embodiment of the first aspect, the voltage source, the diode and the transistor form a freewheeling path or circuit when the switch is in the off state.

In an embodiment of the first aspect, the transistor is arranged to dissipate extra energy not required by the load.

In an embodiment of the first aspect, the voltage source is arranged to provide extra energy required by the load.

In an embodiment of the first aspect, the current source comprises a switching converter and an inductor.

In an embodiment of the first aspect, the switching converter is arranged to generate an alternating voltage to control an inductor current of the inductor when the switch is in the on state and off state exchanging, the inductor current may be regulated by controlling the voltage profile across the inductor through the switching network in the switching converter.

In an embodiment of the first aspect, the switching converter is further arranged to maintain a current through the inductor, the output voltage may be equal to the voltage drop across the equivalent DC resistance of the inductor.

In an embodiment of the first aspect, the diode, the switching convertor and the inductor form a freewheeling path when the switch is in the off state.

In an embodiment of the first aspect, the switching converter is arranged to absorb extra energy or transfer the extra energy to a DC link in connection with both the load and the switching converter.

In an embodiment of the first aspect, the inductor may serve as energy buffer between the source and the load. If the instantaneous power delivered from the source is less than that required by the load, the inductor may provide extra energy required by the load to compensate the power difference. Conversely, if the instantaneous power delivered from the source is more than that required by the load, the inductor may absorb such power difference.

In an embodiment of the first aspect, the switching converter comprises a second switch and a second diode.

In accordance with a second aspect of the present invention, there is provided a method for generating electric current pulses to a load, comprising the step of manipulating a switch and a current source in series connection with the load; wherein the switch is arranged to operate in at least an on state and an off state, thereby selectively connects or disconnect the current source to or from the load so as to generate the electric current pulses.

In an embodiment of the second aspect, the method further comprises the step of maintaining a diode to operate in forward-bias when the switch is in the off state, wherein the diode is in connection with the switch and the current source.

In an embodiment of the second aspect, the diode is arranged to provide an electric path for the current source to freewheel.

In an embodiment of the second aspect, the method further comprises the step of controlling a conduction period and a switching frequency of the switch.

In an embodiment of the second aspect, the method further comprises the step of regulating a current through the current source.

In an embodiment of the second aspect, the method further comprises the step of absorbing a voltage difference between a DC-link voltage and a load voltage across the load.

BRIEF DESCRIPTION OF THE DRAWINGS

Embodiments of the present invention will now be described, by way of example, with reference to the accompanying drawings in which.

DETAILED DESCRIPTION OF THE PREFERRED EMBODIMENT

Electronic devices may be driven by electric current pulses. The inventors have, through their own research, trials and experiments, devised that, for example, the service life of lead-acid batteries may be extended if the batteries are charged by current pulses of defined rise time, pulse frequency, pulse duration and amplitude. In an alternative example, lighting elements may be powered by electric current pulses with pulse-width modulation (PWM) dimming technology, in which the color temperature of the LED output at different brightness may be kept if dimming is achieved by controlling the width or the duty cycle of the current pulses driving the LED.

Figure 1:
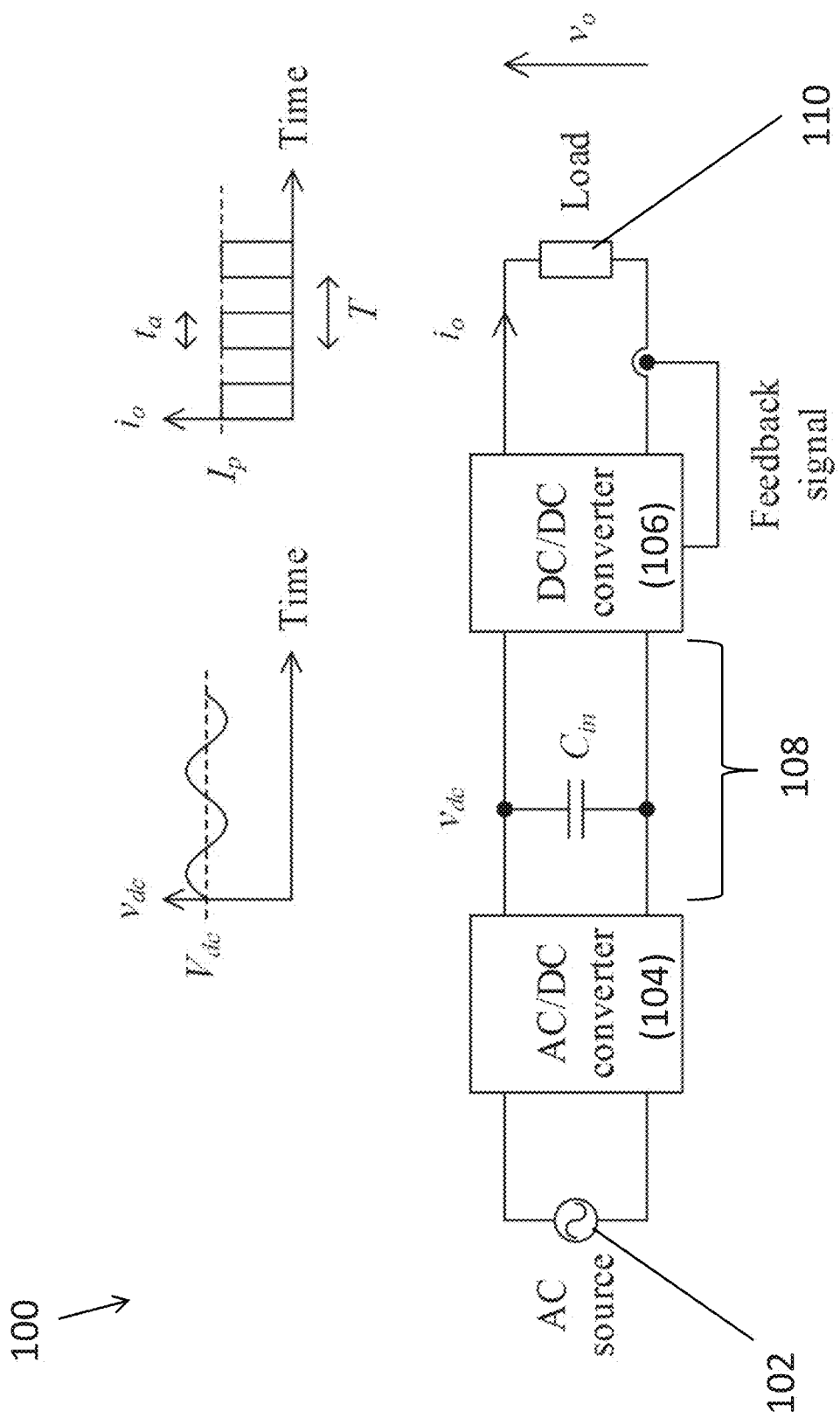
FIG. 1 is a schematic diagram showing an example electric circuit operating in under pulse-width modulation.

With reference to FIG. 1, there is shown an example circuit 100 with a current pulse generator. The current pulse generator may be powered by an AC main supply 102 and the system consists of two stages. The first stage is an AC/DC converter 104 and the second stage is a DC/DC converter 106. The two stages are connected through a DC link 108 which includes a DC-link capacitor.

In this example, the AC/DC converter 104 serves two main functions. The first one is to profile the input current from AC mains 102, so that its input power factor is close to unity. The second one is to regulate the DC-link voltage $v_{dc}$ at an average value of $V_{dc}$. As the input power of the AC/DC converter is time-varying, a DC-link capacitor $C_{in}$ is included to reduce the ripple voltage on $v_{dc}$ and provide the load 110 with sufficient hold-up energy.

Preferably, a DC/DC converter 106 may be used to program the current pulses being supplied to the load 110. Referring to FIG. 1, the output pulses have a width of $t_a$, a frequency of 1/T, and an amplitude of $I_p$. In order to regulate the output current $i_o$, the converter 106 senses $i_o$, compares $i_o$ with a current reference, and modifies the output parameters, including $t_a$, T, and $I_p$, of the output current pulses. Thus, the required power rating of the DC/DC converter 106 is at least the same as the output load 108. If the efficiencies of the AC/DC converter 104 and DC/DC converter 106 are $\eta_1$ and $\eta_2$, respectively, the efficiency of the overall system $\eta$ is equal to $$\eta = \eta_1 \eta_2 \quad (1)$$

For example, if the efficiencies of the two converters or stages are both 98%, the overall efficiency of the system 100 becomes 96.04% (=98%×98%).

Figure 2:
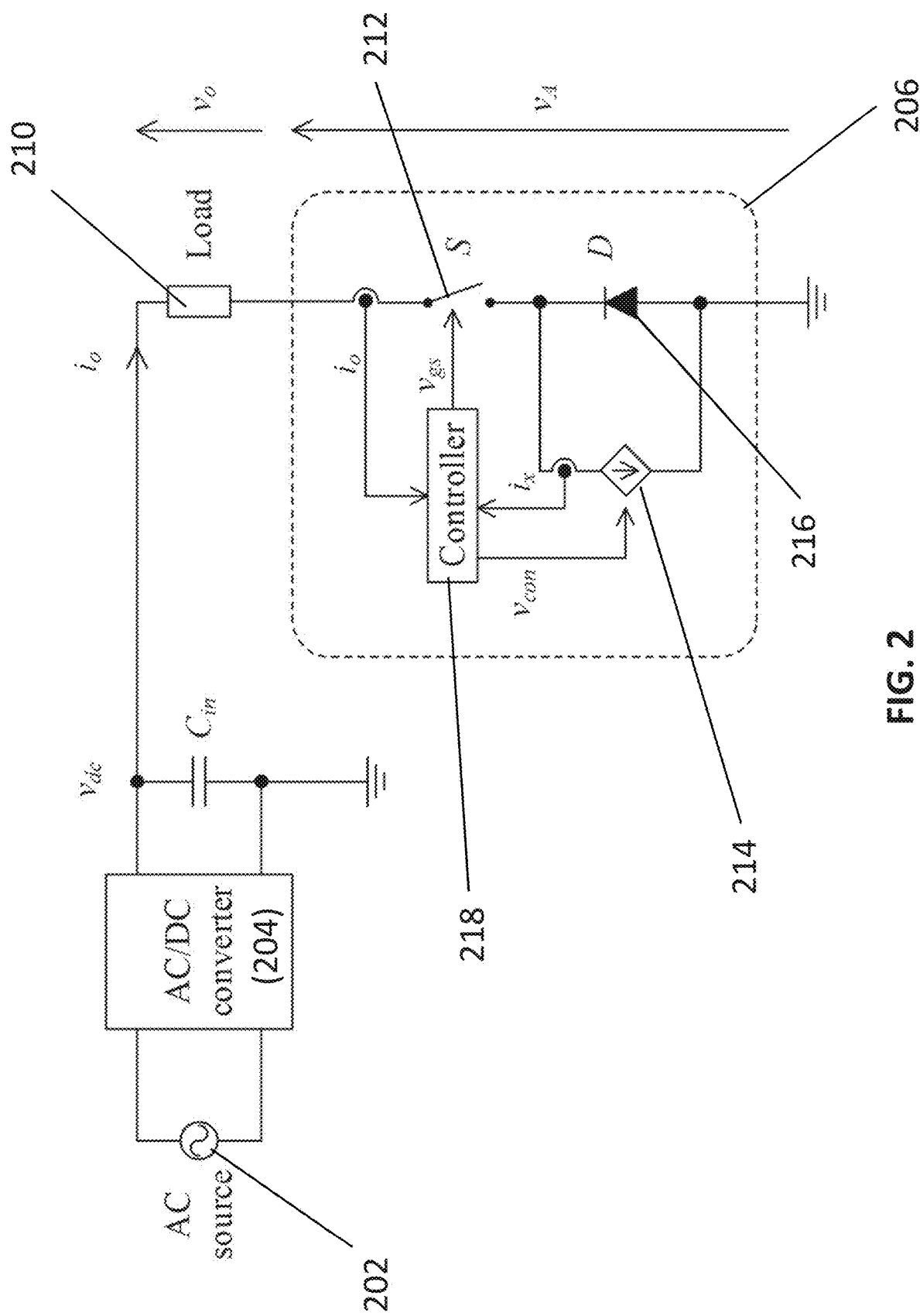
FIG. 2 is a schematic diagram showing an electric circuit including an electric circuit arrangement in accordance with an embodiment of the present invention.

With reference to FIG. 2, there is shown an example embodiment of an electric circuit 200 having an electric circuit arrangement 206 for generating electric current pulses to a load 210. The electric circuit arrangement 206 comprises a switch 212 and a current source 214 in series connection with the load 210; wherein the switch 212 is arranged to operate in at least an on state and an off state, thereby selectively connects or disconnect the current source 214 to or from the load 210 so as to generate the electric current pulses.

In this embodiment, the load 210 is connected directly to an unregulated input DC voltage $v_{dc}$ which may include a high voltage ripple. For example, The AC/DC converter 204 may be a rectifier circuit, and the DC-link capacitor $C_{in}$ may operate to partially smooth $v_{dc}$. To modulate or adjust the power delivered to the load 210, the load 210 is arranged to cooperate with the electric circuit arrangement 206 and hence the combination of the load 210 and the electric circuit arrangement 206 may selectively draw electric power from the unregulated DC input $v_{dc}$, i.e. the output of the AC/DC converter 204.

By precisely controlling the electric circuit arrangement 206, electric current pulses may be generated with variable pulse width, frequency, and amplitude and may be supplied to the load from the unregulated DC source.

Referring to FIG. 2, the switch 212 and the current source 214 are connected in series with the load 210 and the ground. As the switch 212 may operate in the on state and the off state, the switch 212 may selectively connects or disconnect the current source 214 to or from the load 210, and it may also open or close the current path between the load 210 and the ground (through the current source 214), therefore electric current pulses may be generated from the unregulated DC source as a results of the on/off switching operations of the switch 212, and the generated electric current pulses may be regulated or controlled by the switch 212 and the current source 214.

Figure 3A:
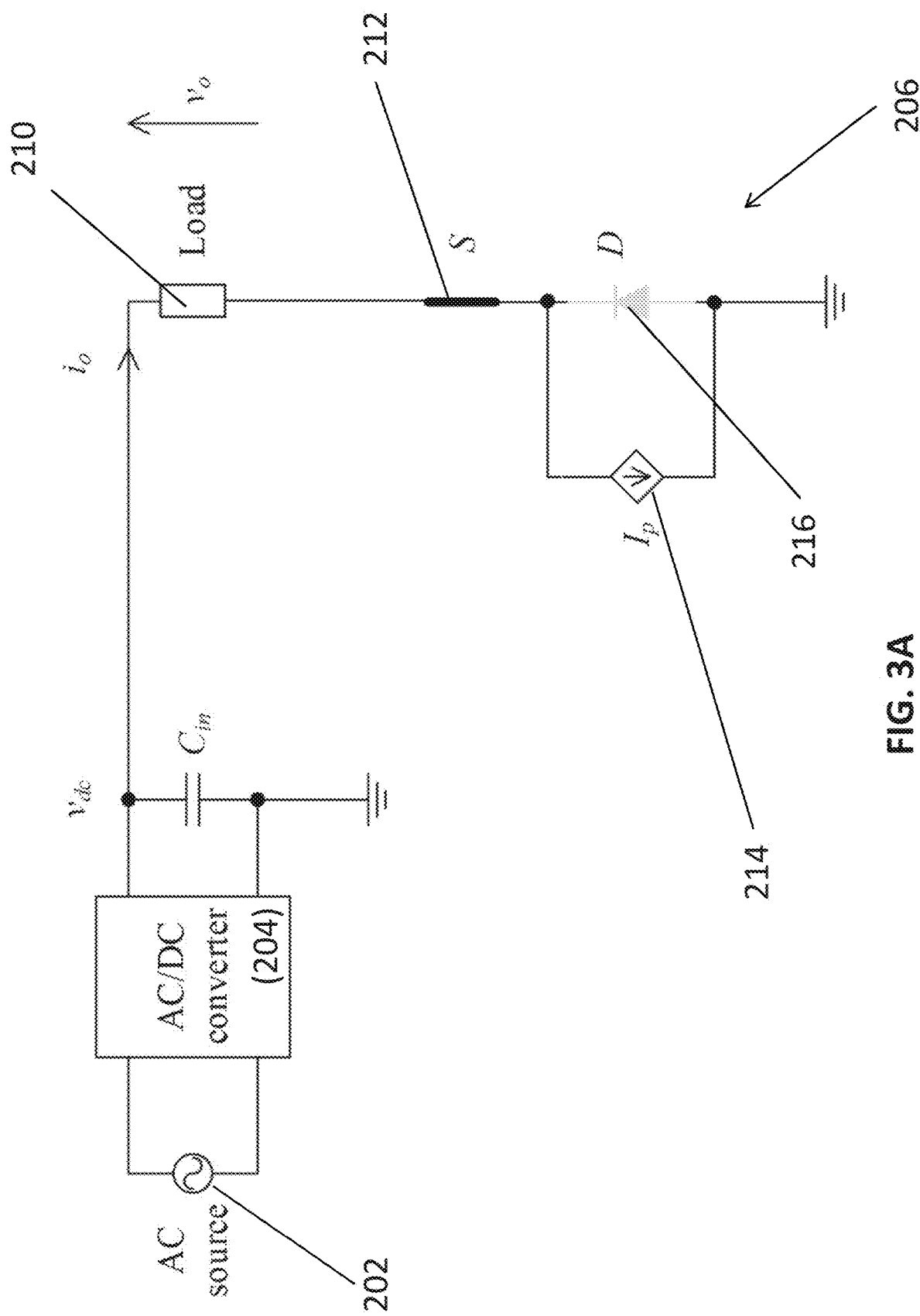
FIGS. 3A and 3B are schematic diagrams of the electric circuit of FIG. 2 in two different operation states.
Figure 3B:
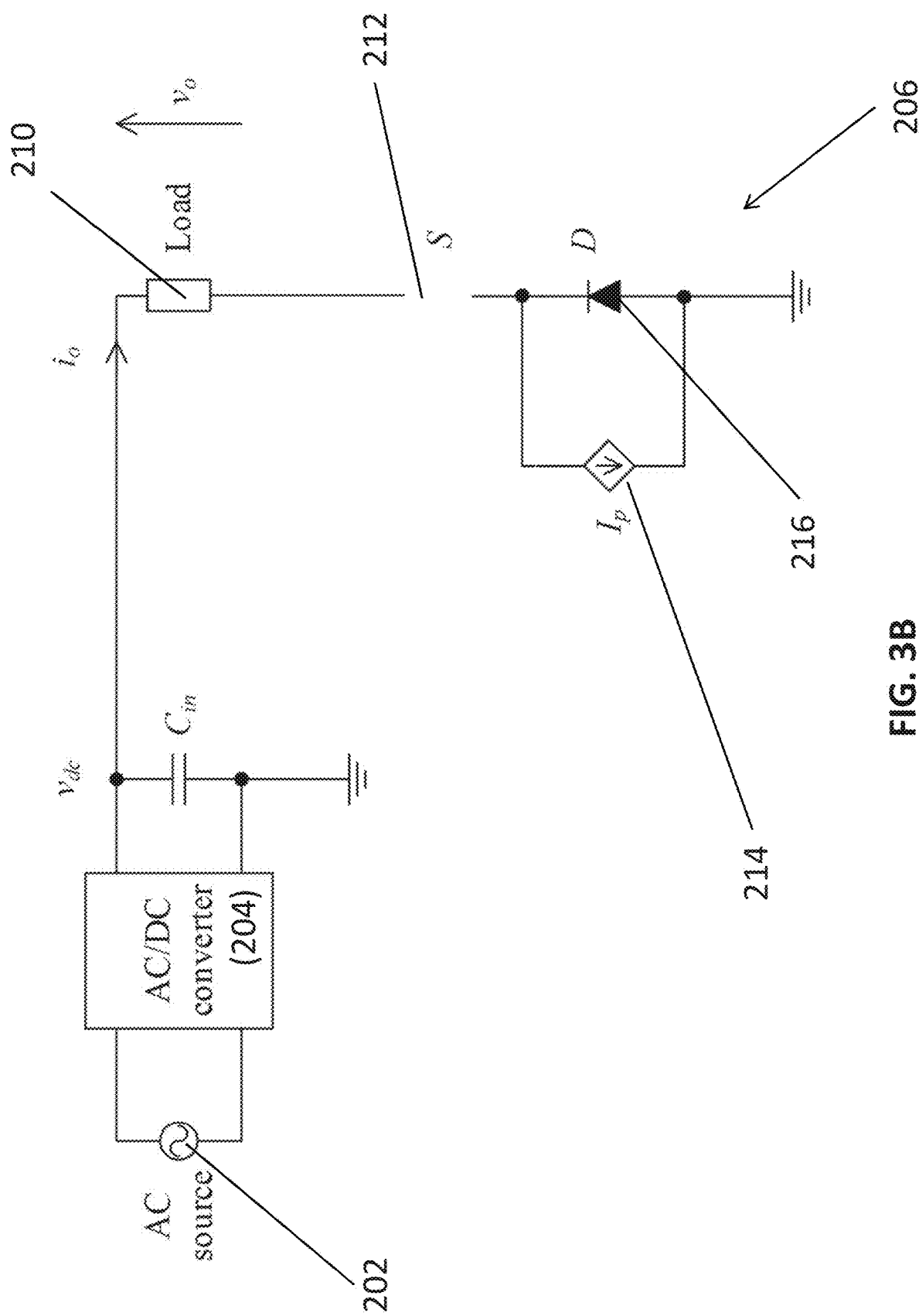

With reference also to FIGS. 3A and 3B, the circuit arrangement further comprises a diode 216, such as a freewheel diode, in connection with the switch 212 and the current source 214. Preferably, the diode 216 is in series with the switch 212 and in parallel with the current source 214, and the diode 216 may operate in different states in response to the operation of the switch 212.

Referring to FIG. 3A, the diode 216 operates in reverse bias when the switch 212 is in the on state. In this condition, the switch 212 connects the current source 214 to the load 210 therefore the current goes through the load 210 and the branch with the current source 214 from the input voltage $v_{dc}$ to the ground.

Referring to FIG. 3B, the diode 216 is arranged to operate in forward-bias when the switch 212 is in the off state. In this condition, the switch 212 disconnects the current source 214 from the load 210 therefore an amount of current through the load 210 equals to zero when the switch 212 is in the off state. On the other side of the switch 212, the freewheel diode 216 provide an electric path for the current source 214 to freewheel.

Alternatively, the diode 216 may be replaced by an active electric component, such as a switch or a transistor, which may be controlled to operate in a similar manner.

The electric circuit arrangement 206 may also comprise a controller 218 for controlling different components in the circuit arrangement, including the switch 212 and the current source 214. For example, the controller is arranged to control a conduction period and a switching frequency of the switch 212. In pulse-width modulation, a reduced amount of electric power may be delivered to the load 210 by repeatedly introducing an off period in which the load 210 does not draw power from the source 202, however the PWM switch frequency should not affect the operation of the load 210. The amount of power may be controlled or reduced by controlling the conduction period or the duty cycle of the conduction pattern.

Preferably, the controller 218 may be implemented as an integrated circuit chip arranged to receive and process required circuit parameters and/or references so as to provide necessary output signals to control the components in the electric circuit arrangement. This may include programmable controllers, processors, gate arrays or logic devices. Alternatively, the controller may be a processor or a computing device arranged to execute machine-readable instructions so as to perform the functions in accordance with the embodiments of the present invention.

With reference back to FIG. 2, the electric circuit arrangement 206 is connected in series with the load 210. It consists of an active switch 212, a diode 216, a controllable current source 214, and a controller 218. In an example operation of the circuit, the controller 218 may detect an output load current through the load 210 (the load current $i_o$), compares the associated processed quantity (such as average value) with a reference, and then determines the conduction time and switching frequency of the active switch 212. The controller 218 may generate the gate signal $v_{gs}$ to dictate the state of the active switch 212 so as to control the switch 212 base on the output load current $i_o$.

The controller 218 may also detect the actual current $i_x$ through the current source 214 so as to regulate the current through the current source 214. It may compare it with a reference $I_p$, and may generate a control signal $v_{con}$ to the current source 214 to control or regulate the current passing through the current source 214 and the load 210.

The switch 212 may be switched on or off by the controller 218, therefore the electric circuit arrangement 206 may operate in at least the following two operating modes. Referring to FIG. 3A, when the active switch 212 is turned on, the diode 216 is reverse biased. In this condition, the current through the load 210 is equal to the value of the current source 214. Since the current through the current source 214 is regulated at $I_p$, the load current $i_o$ is also equal to $I_p$.

Alternatively, Referring to FIG. 3B, when the active switch 212 is turned off, the diode 216 is forward biased. Then, the load current is zero and the diode 216 forms a closed path for the current source 214 to flow, and the electric circuit arrangement 206 is operating in a freewheeling phase.

In the abovementioned operations, the active switch 212 determines the width and frequency of the current pulses supplying to the load. The magnitude of the current source determines the amplitude of the pulses.

In addition, the electric current arrangement 206 may be arranged to provide extra energy required by the load 210 or to dissipate or absorb extra energy not required by the load, i.e. from the DC-link or the unregulated DC source.

The average voltage across the electric circuit arrangement $v_A$ may be expressed as $$v_A = v_{dc} - v_o \quad (2)$$

Thus, if the value of $v_{dc}$ is designed to be closer to the value of $v_o$, the value of $v_A$ will be small. The required power rating of the electric circuit arrangement 206 will then be small as well.

Based on (2), the relationships among the DC-link power, $P_{dc}$, load power $P_o$, and power handled by the electric circuit arrangement $P_A$ may be expressed as $$P_A = P_{dc} - P_o \quad (3)$$

Based on the above equations, if $v_{dc} > v_o$, $v_A$ and $P_A$ are positive, implying that the current source 214 is arranged to absorb power from the DC link. If $v_{dc} < v_o$, $v_A$ and $P_A$ are then negative, implying that the current source 214 is arranged to provide power to the load 210.

As the electric circuit arrangement 206 is connected in series with the load 210. It shares a part of the DC-link voltage. Hence, $$v_{dc} = v_o + v_A \quad (4)$$

If $V_{dc}$ is designed to be slightly higher than $v_o$, $v_A$ will be much smaller than $v_o$. The overall efficiency of the system 200 can be much higher than the circuit 100 as shown in FIG. 1. For the sake of comparison, it may be assumed that the DC link has zero ripple. Let $V_{dc}$ be the average value of $v_{dc}$, $I_o$ be the average value of $i_o$, and $V_o$ be the average value of $v_o$. Assume that the efficiency of the switching circuit is $\eta_3$. The power loss of the switching circuit, $P_{loss}$, is $$P_{loss} = (1 - \eta_3) V_A I_o \quad (5)$$
$$= (1 - \eta_3)(V_{dc} - V_o) I_o$$

Thus, the overall efficiency of the system $\eta'$ is $$\eta' = \eta_1 \frac{V_o I_o}{V_o I_o + P_{loss}} \quad (6)$$
$$= \eta_1 \frac{1}{\eta_3 + (1 - \eta_3) \frac{V_{dc}}{V_o}}$$

Based on (6), with $\eta_1 = 98\%$, if the efficiency of the electric circuit arrangement, $\eta_3$, is 98% and $V_{dc}$ is designed to be 20% higher than $V_o$, the overall efficiency becomes 97.6%. With such architecture, the circuit performs with a better efficiency than a cascaded architecture with reference to FIG. 1.

Moreover, the power rating of the electric circuit arrangement 206 may be much smaller than the load power. For example, if the DC-link voltage is 20% higher than the load voltage, the power rating of the circuit arrangement 206 is only one-fifth of the load power. This may result in an increase in the power density of the overall system.

The said current source 214 may be preferably implemented by a linear circuit or a switching circuit.

Figure 4A:
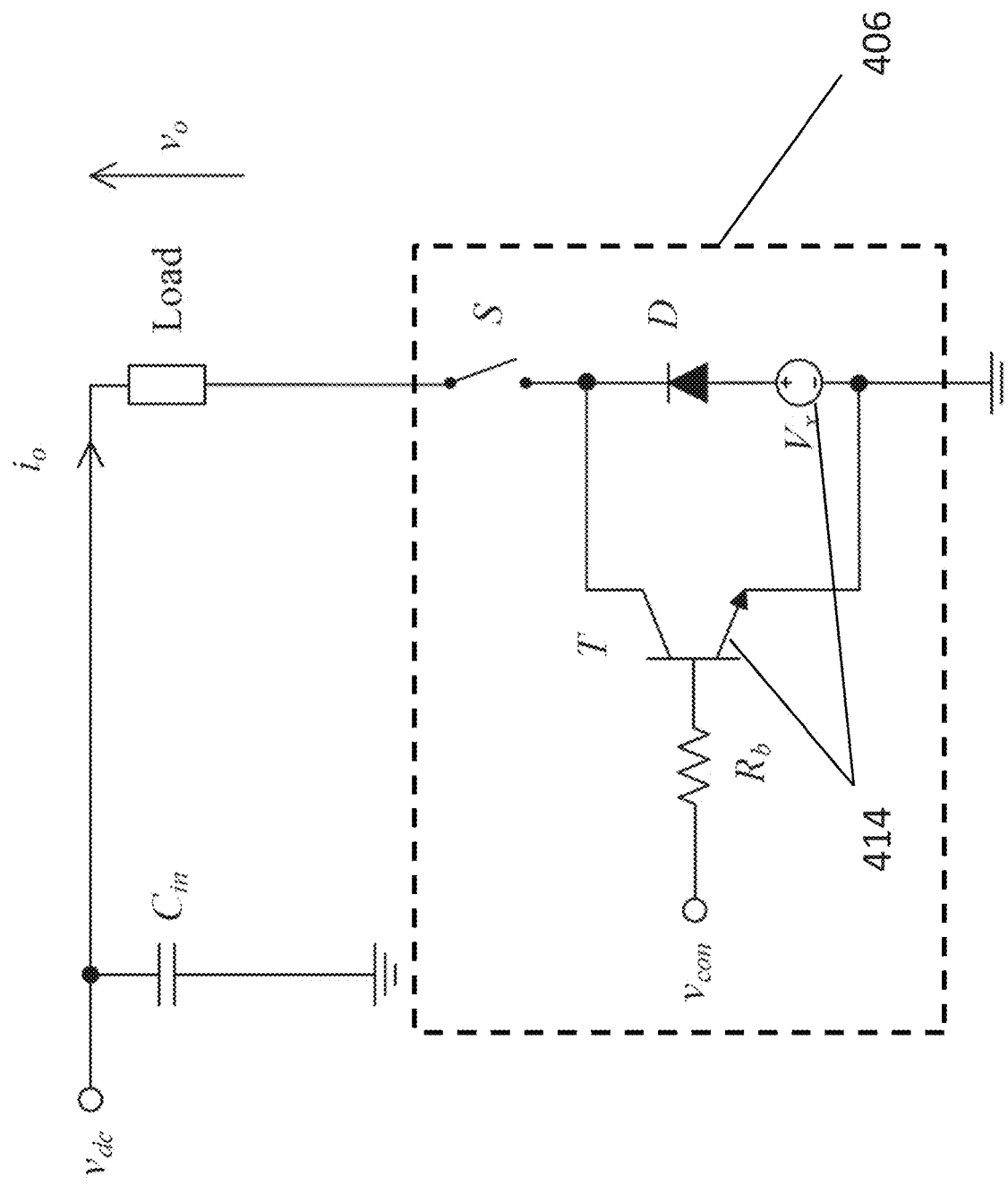
FIGS. 4A and 4B are schematic diagrams of an electric circuit including an electric circuit arrangement in accordance with an embodiment of the present invention, wherein the positions of the voltage source are different.
Figure 4B:
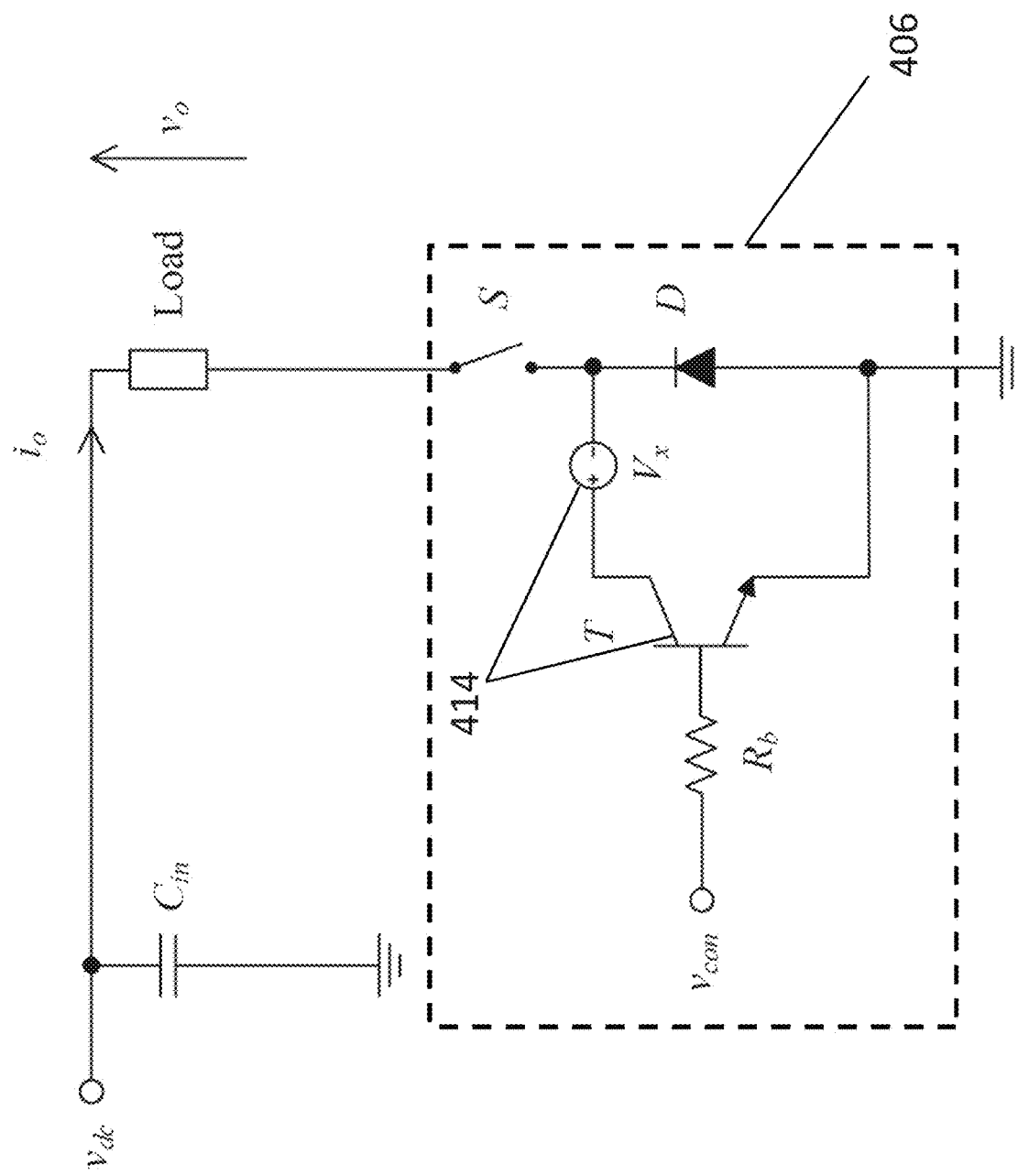

With reference to FIGS. 4A and 4B, there is provided an example embodiment of the electric circuit arrangement 406. In this embodiment, the current source 414 comprises a transistor T and a voltage source $V_x$. Referring to FIG. 4A, the DC-link voltage is higher than the load voltage. The transistor acts as a controllable current source 414 with its magnitude determined by the control voltage $v_{con}$. Preferably, the transistor may be a bipolar transistor with reference to the figures, however other types of transistors such as field-effect transistors may also be used with the appropriate control topologies applied to the control gate or terminal.

As discussed above, the electric circuit arrangement 406 may operate in at least two states. When the active switch S is turned on, the collector current of the transistor is the same as the load current. The collector-emitter voltage of the transistor is then equal to the difference between the DC-link voltage and the load voltage. The transistor will dissipate energy caused by such voltage difference in this case. When the active switch is turned off, the diode D, the voltage source $V_x$, and the transistor form a closed path or a closed loop. Thus, the current through the transistor can be maintained.

Figure 5:
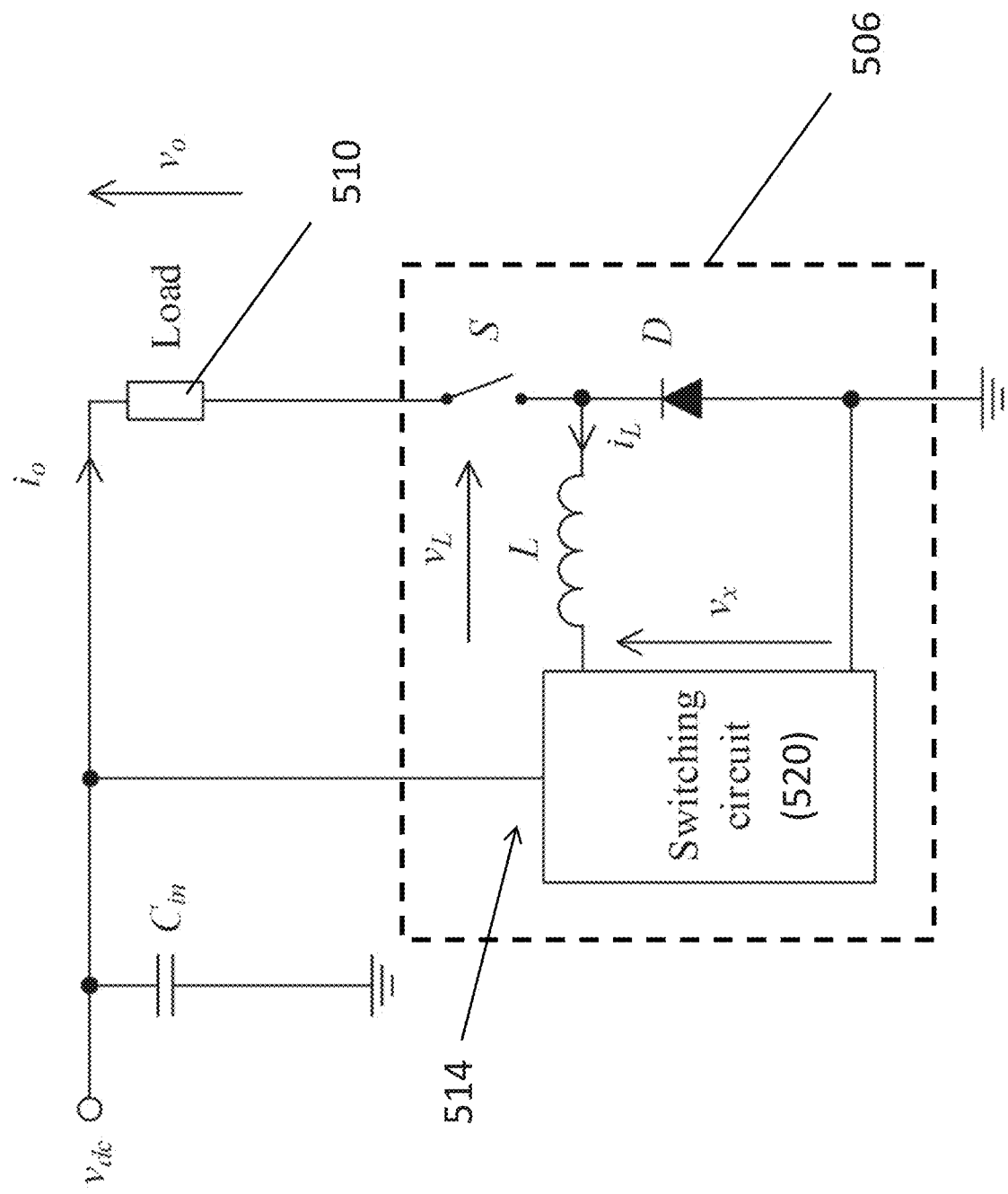
FIG. 5 is a schematic diagram of an electric circuit including an electric circuit arrangement in accordance with an alternative embodiment of the present invention.

In an alternative embodiment, with reference to FIG. 5, the current source 514 of the electric circuit arrangement 506 may comprise a switching converter 520 and an inductor L. In this example, the inductor is used to maintain the current. A port of the switching converter 520 may be connected to a source, which may be the DC link. In addition, the diode D, the switching convertor 520 and the inductor L form a closet loop or a freewheeling path when the switch S is in the off state.

During an example operation, when the active switch S is turned on, the switching converter 520 may be arranged to generate an alternating voltage $v_x$ to control (increase or decrease) an inductor current of the inductor when the switch is in the on state. At steady state, when the inductor current has reached the target average current, the switching converter 520 is further arranged to maintain a current through the inductor by controlling $v_x$ is controlled. In case of an ideal inductor, a steady-state average inductor voltage of the inductor may be maintained to zero.

When the active switch S is turned off, $v_x$ may be controlled to a small negative voltage to counteract the forward voltage of the diode D, and the voltage drop across the equivalent resistance of the inductor. Preferably, as the diode forward voltage is zero and the inductor has zero resistance, $v_x$ can be controlled to a zero-value.

If $v_{dc} > v_o$, $v_A$ and $P_A$ are positive, implying that the switching converter 520 may absorb power to the DC link. However, if another port of the switching circuit 520 is connected to the DC link, the processed energy will be transferred back to the DC link. If $v_{dc} < v_o$, $v_A$ and $P_A$ are then negative, implying that energy is transferred from the switching circuit 520 to the load 510.

As the electric circuit arrangement 506 shares the difference between the DC-link voltage and the load voltage, it allows a wide fluctuation in the DC-link voltage. Advantageously, a small DC-link capacitor may be used.

When $v_{dc} < v_o$, the switching circuit 520 will transfer power to the load 510. Similar to the case when $v_{dc} > v_o$, the power handled by the switching circuit 520 is much smaller than the load power if $v_{dc}$ is designed to be closer to $v_o$. Under this condition, the switching circuit may recycle energy back to the DC link.

Figure 6:
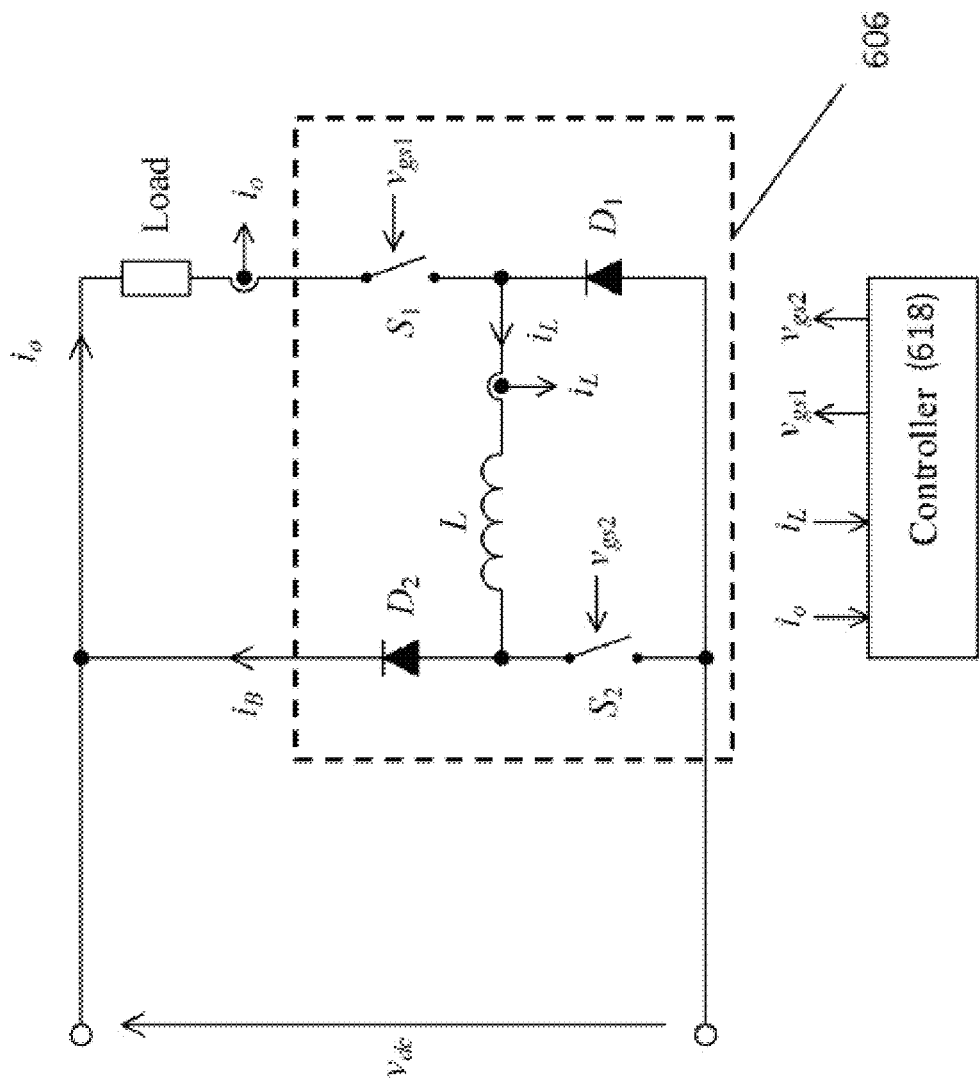
FIG. 6 is a schematic diagram of an electric circuit including an electric circuit arrangement of FIG. 5, wherein the switching converter is implemented by a switch and a diode.
Figure 7:
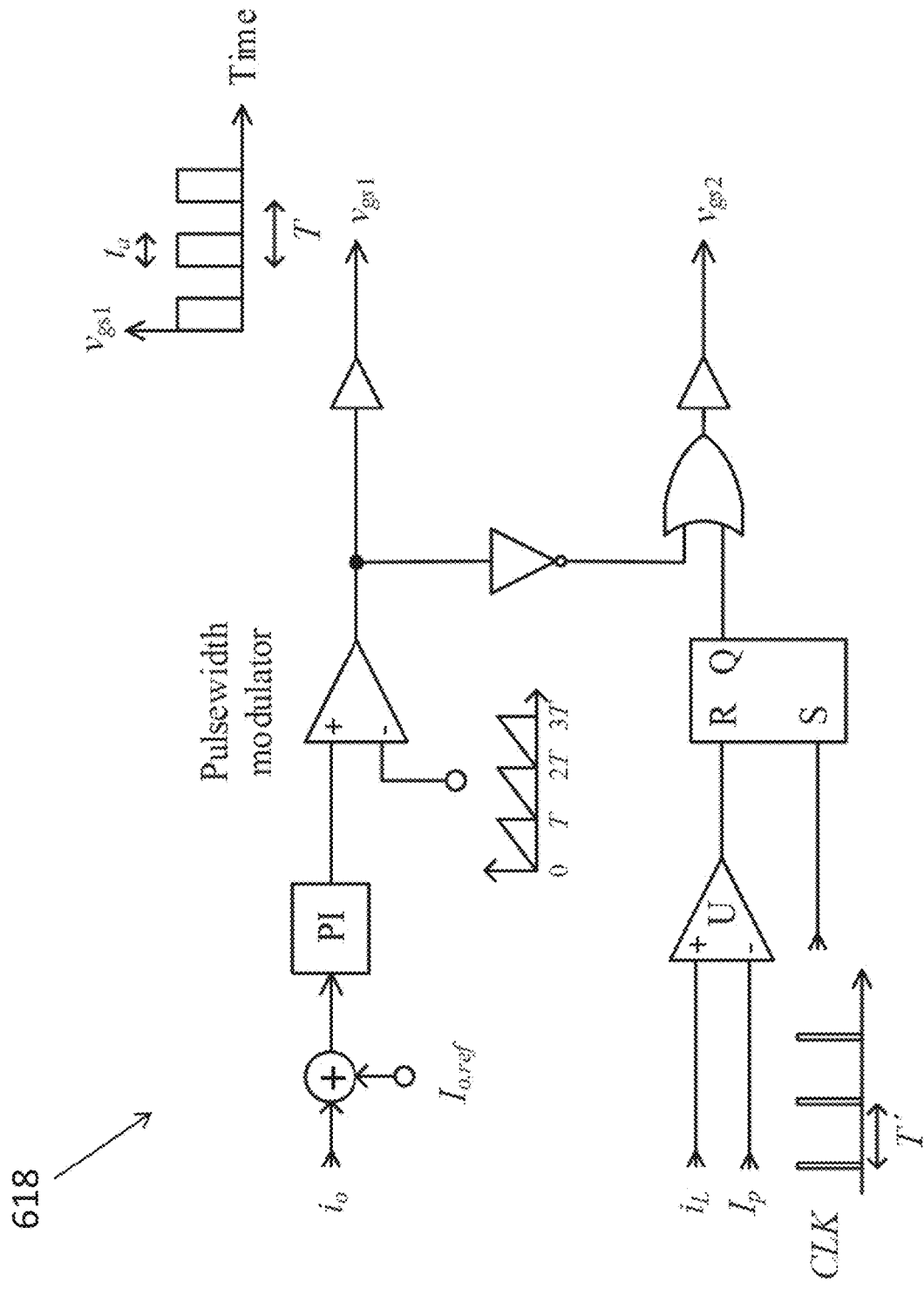
FIG. 7 is a functional block diagram of the controller of the electric circuit arrangement of FIG. 6.

With reference to FIG. 6, there is shown an alternative embodiment of the electric circuit arrangement. In this embodiment, the switching converter comprises a second switch $S_2$ and a second diode $D_2$, therefore the electric circuit arrangement 606 may include two switching devices, $S_1$ and $S_2$, two diodes, $D_1$ and $D_2$, and an inductor L. With reference also to FIG. 7, a controller 618 is used to sense the load current $i_o$ and inductor current $i_L$ and then dictate the states of the switching devices $S_1$ and $S_2$.

The steady-state operation of the electric circuit arrangement 606 is described as follows. The switching device $S_1$ is switched at a lower frequency than the switching device $S_2$. The conduction time of the switching device $S_1$ determines the width of the current pulses applied to the load. The gate signal to $S_1$, $v_{gs1}$, has the conduction time of $t_a$ in a switching period T. When $S_1$ is turned on, $S_2$ is switched at a high frequency.

Figure 8A:
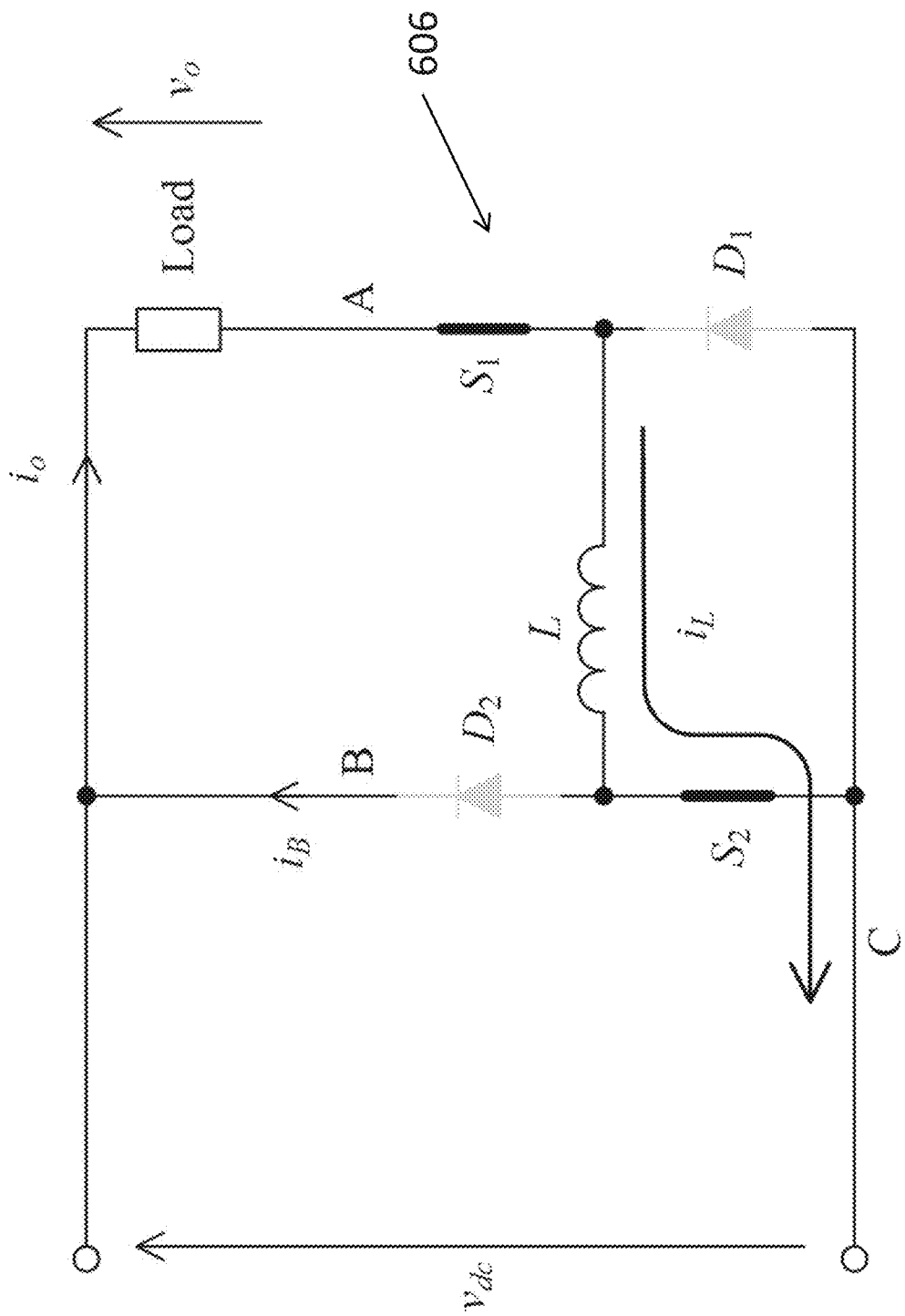
FIGS. 8A, 8B, and 8C are schematic diagrams of the electric circuit of FIG. 6 in three different operation states.
Figure 8B:
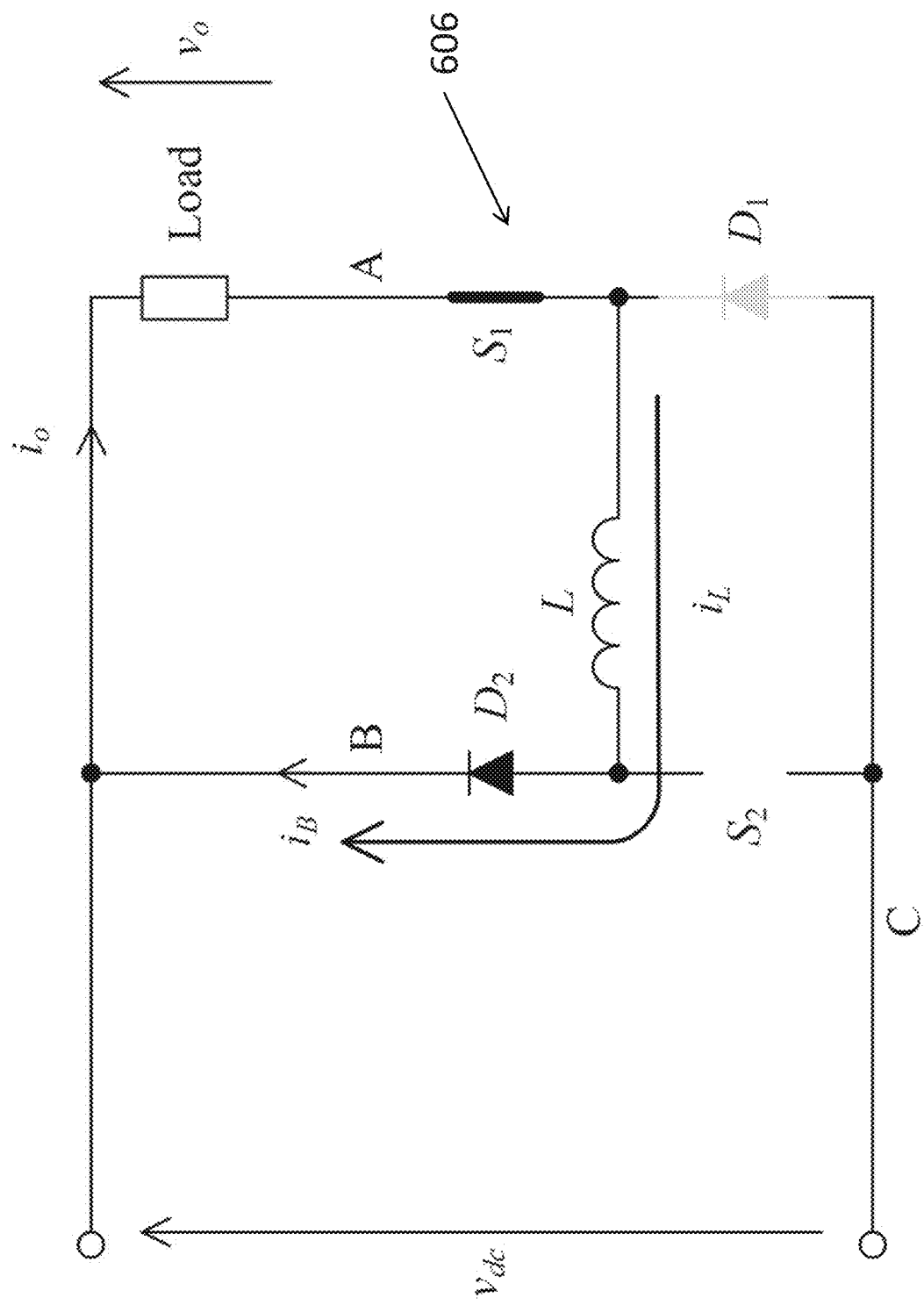

With reference to FIGS. 8A and 8B, the electric circuit arrangement 606 may operate with two switching topologies.

When $S_2$ is turned on, the inductor current $i_L$ will increase. The rate of change of the inductor current is $$\frac{di_L}{dt} = \frac{v_{dc} - v_o}{L} \quad (7)$$

When $S_2$ is turned off, the inductor current $i_L$ will decrease. The rate of change of the inductor current is $$\frac{di_L}{dt} = -\frac{v_o}{L} \quad (8)$$

The peak value of the inductor current is regulated at $I_p$ by a peak-current control mechanism shown in FIG. 7. $I_p$ is the peak value of the current pulses supplied to the load. The peak-current control regulates the peak value of the inductor current. The reference value $I_p$ is defined externally from the current control. If $i_L > I_p$, the comparator U will generate a gate signal to $v_{gs2}$ through an SR Latch to turn off $S_2$. If the clock signal, CLK, is high, the SR Latch will turn on $S_2$. The period of CLK, T', e.g. at 250 kHz, is much smaller than T.

The function of the peak-current control is to regulate the inductor current at a peak value of the current pulses. Alternatively, other inductor current programming technologies, such as average-current control and bang-bang control, may also be applied.

Figure 8C:
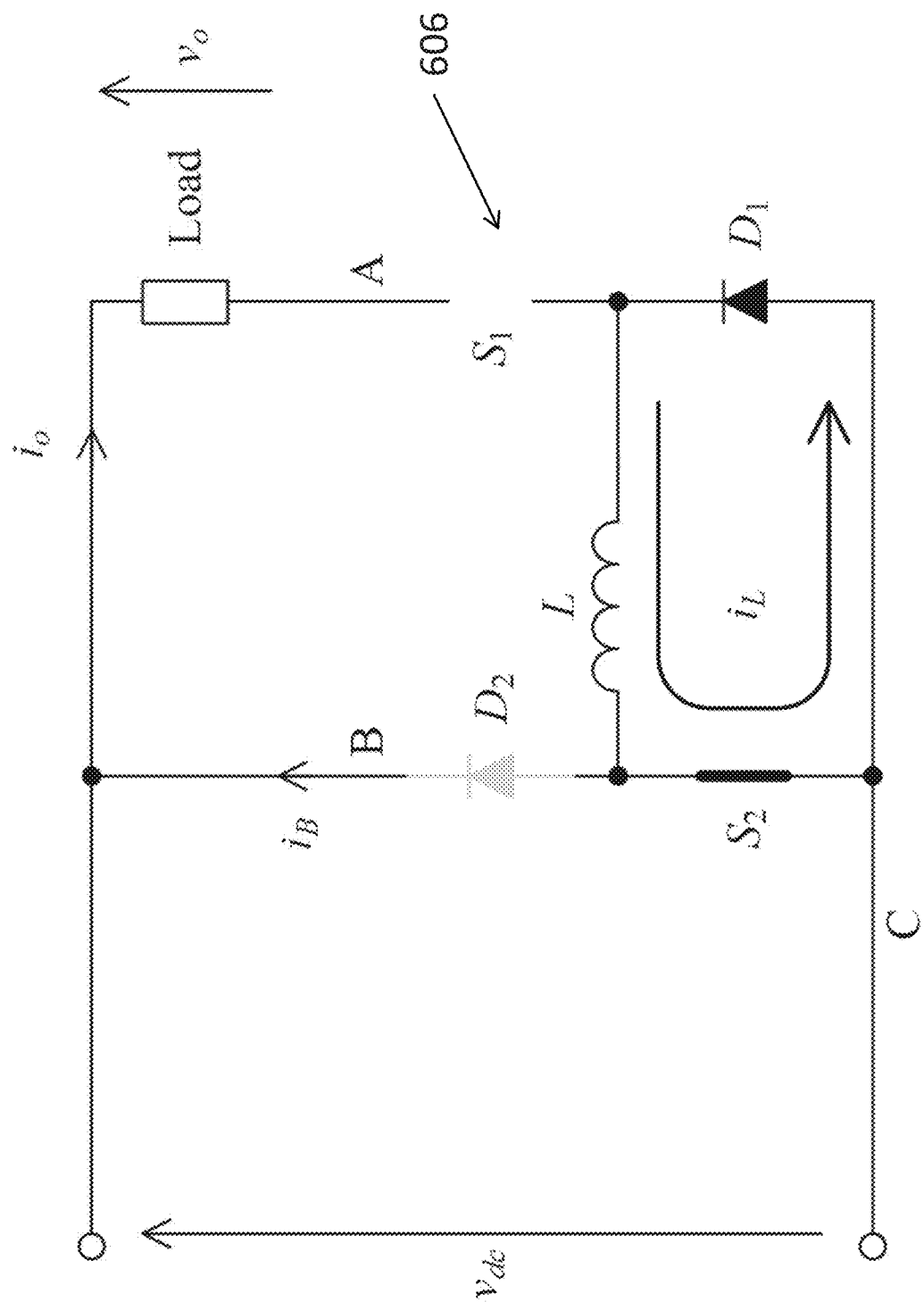

With reference to FIG. 8C, when $S_1$ is turned off, $S_2$ is switched on and the inductor current is freewheeling through $S_2$ and the diode $D_1$. Preferably, the inductor current remains unchanged in this freewheeling stage. However, the inductor current may diminish as energy will be dissipated in $S_2$, $D_1$, resistance of the inductor, and parasitic elements in the current loop in the freewheeling phase. Optionally, referring also to FIG. 4A, a voltage source $V_x$ may be connected in series with $D_1$ to counteract the total voltage drop in the current loop.

Figure 9:
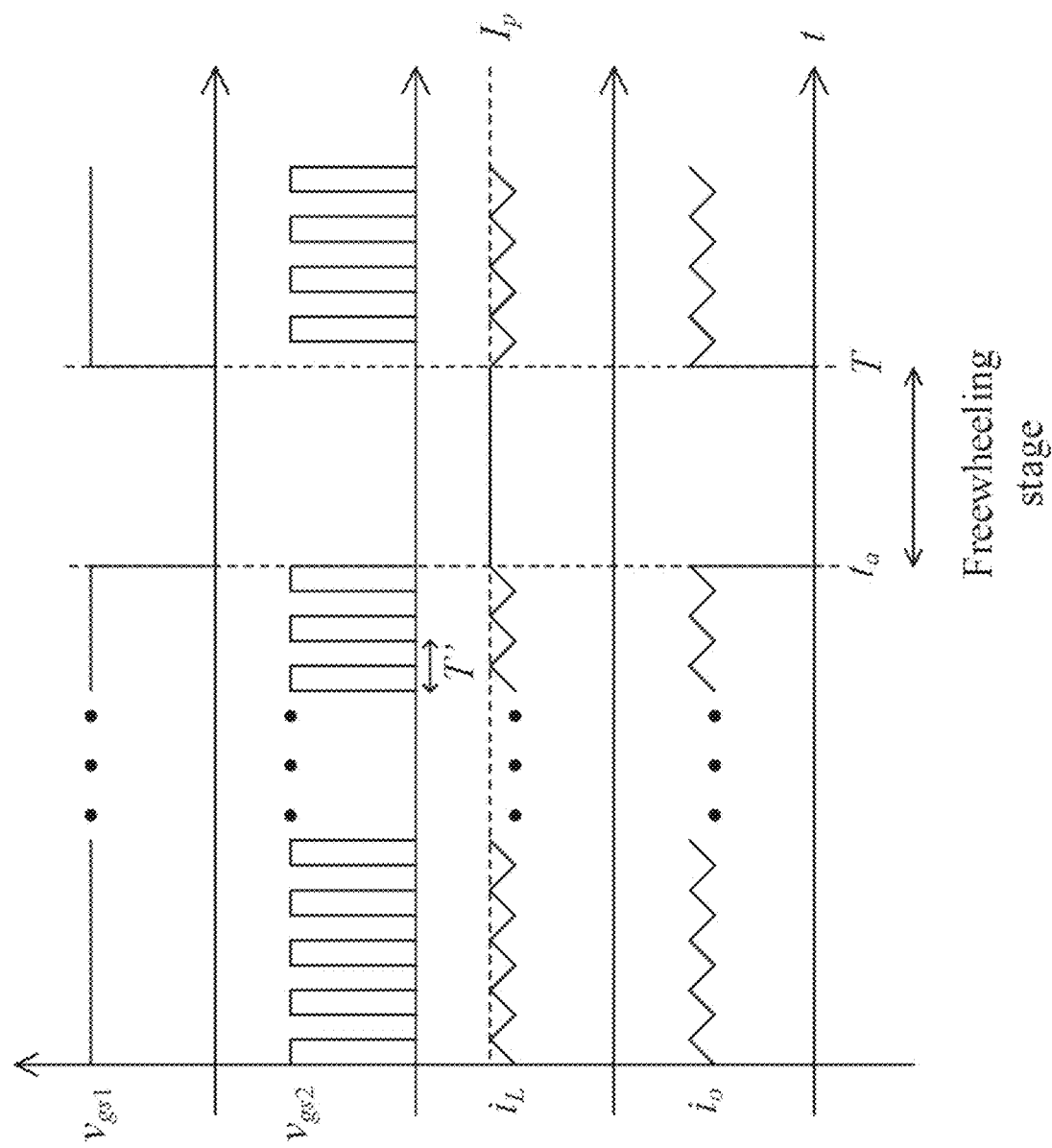
FIG. 9 is a plot showing waveforms of circuit parameters during an operation of the electric circuit of FIG. 6.

With reference to FIG. 9, there is shown the key waveforms of the operation of the abovementioned embodiments.

These embodiments may be advantageous in that the power rating of the electric circuit arrangement for generating the current pulses to the load can be much smaller than the load power. This may increase the power density of the system and energy efficiency of the overall system.

Advantageously, as the electric circuit arrangement is connected in series with the load, it may operate as a buffer to absorb the voltage difference between the DC-link voltage and load voltage. Thus, the regulated current pulses can be produced even if there is a wide fluctuation in the DC-link voltage. Thus, this can allow using a small DC-link capacitor to stabilize the DC-link voltage.

In addition, the rise time of the generated current pulses may be very short, as the inductor has an initial current flowing through the load. Once the inductor is connected to the load, the load current will be driven to the peak value in a very short time.

For evaluation purpose, the inventors have built a prototype of the embodiment of the present invention with reference to the schematic in FIG. 6. The load can be of different types. In the experiment, a LED string is used as the load. The average value of $v_{dc}$ is 55V and $I_p$ is 75 mA. The switching frequency of $S_1$ is 2 kHz with 90% duty. The switching actions of $S_2$ are determined by comparing $I_L$ with $I_p$.

Figure 10A:
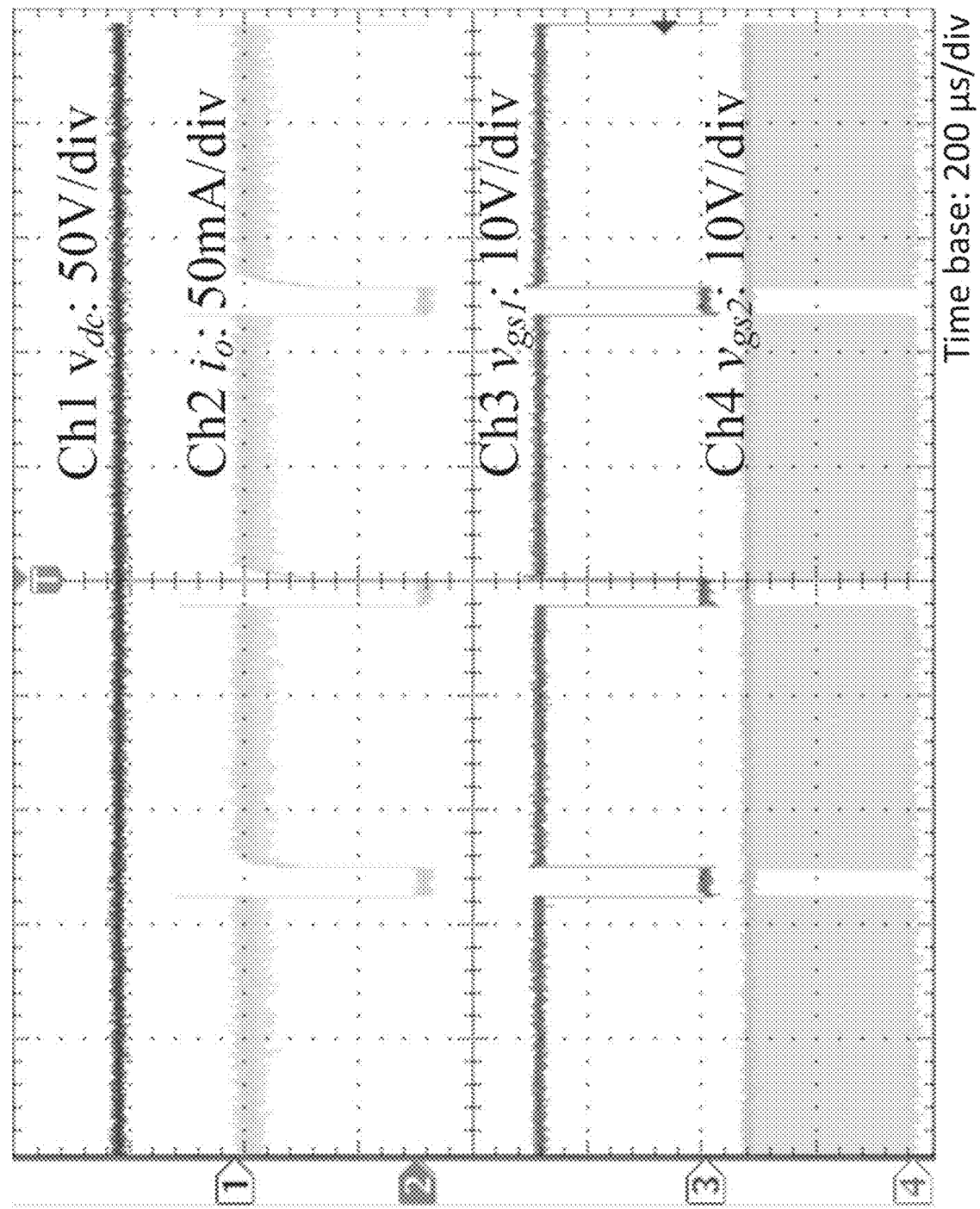
FIGS. 10A and 10B are plots showing experimental results of the electric circuit of FIG. 6, wherein the time bases of the plots are 200 µs/div and 4 µs/div respectively.

With reference to FIG. 10A, there is shown the measured waveforms of $v_{dc}$, $i_o$, $v_{gs1}$ and $v_{gs2}$ in time base of 200 μs/div. Narrow rise time and fall time of the regulated current pulses $i_o$ are achieved. In freewheeling stage, $S_1$ is off and the freewheel diode $D_1$ provides a short-circuit path for the inductor to sustain the magnitude of $I_L$. Thus, $i_o$ can be supplied instantly from $I_L$ when $S_1$ switch on. It is shown that the electric circuit arrangement is capable of regulating $i_o$ passing through the load at the designed peak value $I_P$.

Figure 10B:
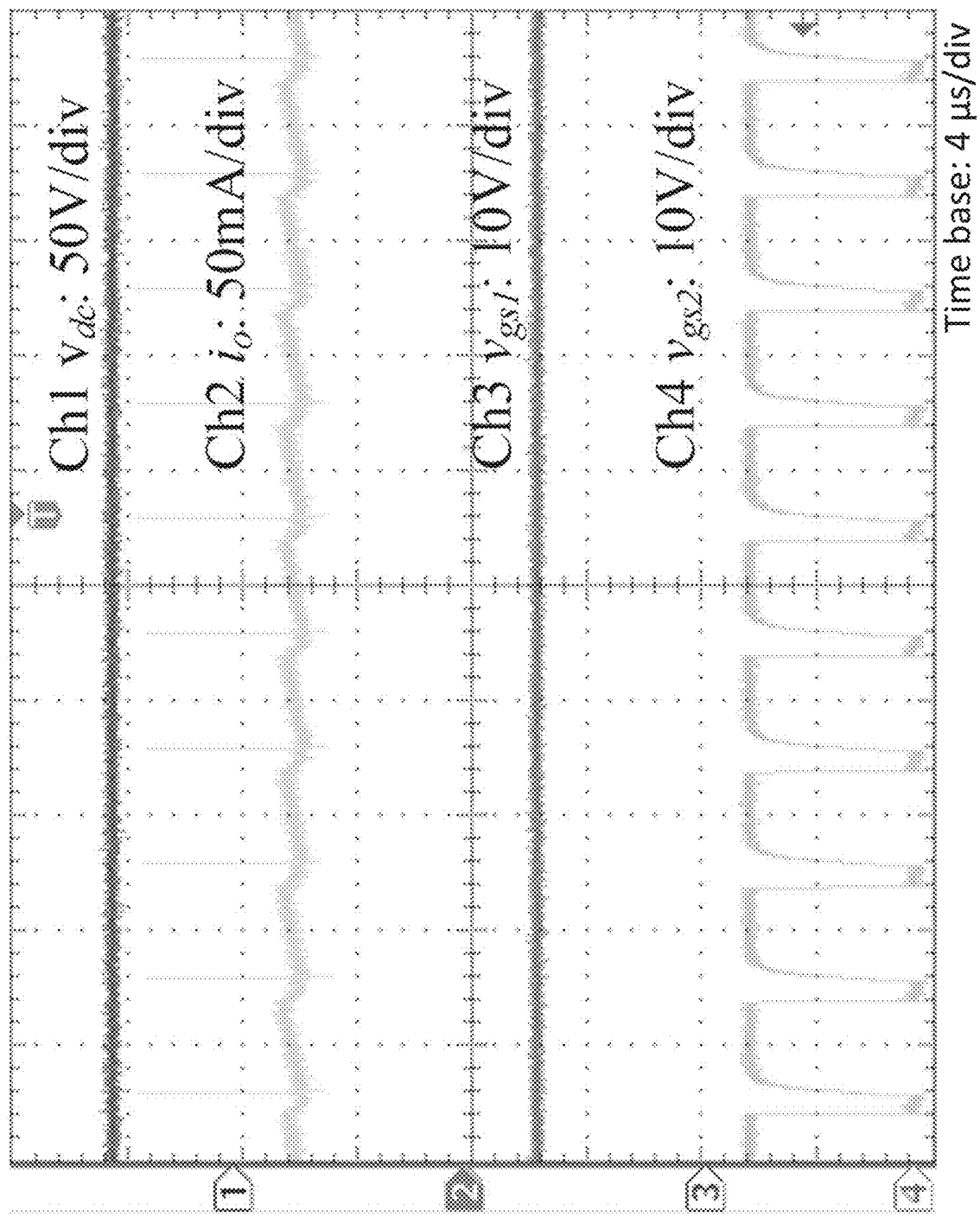

With reference to FIG. 10B, there is shown the zoomed waveforms of $v_{dc}$, $v_{gs1}$, $v_{gs2}$ and $i_o$ in time base of 4 μs/div. When $S_1$ is on, the peak value of the current pulses is regulated by controlling the switching actions of $S_2$.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

It will also be appreciated that where the methods and systems of the present invention may be either wholly implemented by computing system or partly implemented by computing systems then any appropriate computing system architecture may be utilised. This will include standalone computers, network computers and dedicated hardware devices. Where the terms "computing system" and "computing device" are used, these terms are intended to cover any appropriate arrangement of computer hardware capable of implementing the function described.

Any reference to prior art contained herein is not to be taken as an admission that the information is common general knowledge, unless otherwise indicated.

The invention claimed is:

1. An electric circuit arrangement for generating electric current pulse to a load, comprising a switch and a current source, wherein the switch, the current source and the load are in series connection with a DC source arranged to power the load; wherein the switch is arranged to operate in at least an on state and an off state, thereby selectively connects or disconnect the current source to or from the load so as to generate the electric current pulses; wherein the current source is operable to compensate a power difference between the DC source and the load, by absorbing electric power from the DC source when an instantaneous power provided by the DC source exceed a load power required by the load, and providing the absorbed electric power to the load when the instantaneous power provided by the DC source is less than the load power required by the load.

2. The electric circuit arrangement in accordance with claim 1, wherein the electric current pulses are generated from the DC source having a high voltage ripple.

3. The electric circuit arrangement in accordance with claim 1, further comprising a diode in connection with the switch and the current source, and arranged to operate in forward-bias when the switch is in the off state.

4. The electric circuit arrangement in accordance with claim 3, wherein the diode is arranged to provide an electric path for the current source to freewheel.

5. The electric circuit arrangement in accordance with claim 4, wherein an amount of current through the load equals to zero when the switch is in the off state.

6. The electric circuit arrangement in accordance with claim 3, wherein the diode is a freewheeling diode.

7. The electric circuit arrangement in accordance with claim 3, wherein the current source comprises a transistor and a voltage source.

8. The electric circuit arrangement in accordance with claim 7, wherein the voltage source, the diode and the transistor form a freewheeling circuit when the switch is in the off state.

9. The electric circuit arrangement in accordance with claim 7, wherein the transistor is arranged to dissipate extra energy not required by the load.

10. The electric circuit arrangement in accordance with claim 7, wherein the voltage source is arranged to provide extra energy required by the load.

11. The electric circuit arrangement in accordance with claim 1, further comprising a controller arranged to control the switch and/or the current source.

12. The electric circuit arrangement in accordance with claim 11, wherein the controller is arranged to control a conduction period and a switching frequency of the switch.

13. The electric circuit arrangement in accordance with claim 12, wherein the controller is arranged to detect an output load current through the load so as to control the switch based on the output load current.

14. The electric circuit arrangement in accordance with claim 11, wherein the controller is arranged to regulate a current through the current source.

15. The electric circuit arrangement in accordance with claim 14, wherein the controller is arranged to detect the current through the current source so as to regulate a magnitude of the current source.

16. The electric circuit arrangement in accordance with claim 1, wherein the current source comprises a switching converter and an inductor.

17. The electric circuit arrangement in accordance with claim 16, wherein the switching converter is arranged to generate an alternating voltage to control an inductor current of the inductor when the switch is in the on state.

18. The electric circuit arrangement in accordance with claim 17, wherein the switching converter is further arranged to maintain a current through the inductor.

19. The electric circuit arrangement in accordance with claim 16, further comprising a diode in connection with the switch and the current source, and arranged to operate in forward-bias when the switch is in the off state, wherein the diode, the switching convertor and the inductor form a freewheeling circuit when the switch is in the off state.

20. The electric circuit arrangement in accordance with claim 16, wherein the switching converter is arranged to absorb extra energy from or transfer extra energy to a DC link in connection with both the load and the switching converter.

21. The electric circuit arrangement in accordance with claim 16, wherein the inductor is arranged to provide extra energy required by the load.

22. The electric circuit arrangement in accordance with claim 16, wherein the switching converter comprises a second switch and a second diode.

23. A method for generating electric current pulses to a load, comprising the step of manipulating a switch and a current source in series connection with the load and a DC source; wherein the switch is arranged to operate in at least an on state and an off state, thereby selectively connects or disconnect the current source to or from the load so as to generate the electric current pulses; wherein the current source is operable to compensate a power difference between the DC source and the load, by absorbing electric power from the DC source when an instantaneous power provided by the DC source exceed a load power required by the load, and providing the absorbed electric power to the load when the instantaneous power provided by the DC source is less than the load power required by the load.

24. The method for generating electric current pulses to a load in accordance with claim 23, further comprising the step of maintaining a diode to operate in forward-bias when the switch is in the off state, wherein the diode is in connection with the switch and the current source.

25. The method for generating electric current pulses to a load in accordance with claim 24, wherein the diode is arranged to provide an electric path for the current source to freewheel.

26. The method for generating electric current pulses to a load in accordance with claim 23, further comprising the step of controlling a conduction period and a switching frequency of the switch.

27. The method for generating electric current pulses to a load in accordance with claim 23, further comprising the step of regulating a current through the current source.

28. The method for generating electric current pulses to a load in accordance with claim 23, further comprising the step of absorbing a voltage difference between a DC-link voltage and a load voltage across the load.

* * * * *